(12) United States Patent
Tanaka et al.

(10) Patent No.: US 11,269,177 B2
(45) Date of Patent: Mar. 8, 2022

(54) OPTICAL SENSOR, SCANNER UNIT, AND IMAGE FORMING APPARATUS

(71) Applicant: CANON KABUSHIKI KAISHA, Tokyo (JP)

(72) Inventors: Shunsuke Tanaka, Yokohama (JP); Kazunari Fujii, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/654,969

(22) Filed: Oct. 16, 2019

(65) Prior Publication Data
US 2020/0049980 A1    Feb. 13, 2020

Related U.S. Application Data

(63) Continuation of application No. 15/654,369, filed on Jul. 19, 2017, now Pat. No. 10,481,392.

(30) Foreign Application Priority Data

Jul. 22, 2016   (JP) .................................. 2016-144638

(51) Int. Cl.
| | |
|---|---|
| *G02B 26/10* | (2006.01) |
| *G02B 26/12* | (2006.01) |
| *H01L 23/00* | (2006.01) |
| *H01L 23/31* | (2006.01) |
| *G02B 6/12* | (2006.01) |

(52) U.S. Cl.
CPC ......... *G02B 26/105* (2013.01); *G02B 26/127* (2013.01); *H01L 24/00* (2013.01); *G02B 2006/12138* (2013.01); *H01L 23/3121* (2013.01); *H01L 2224/022* (2013.01); *H01L 2224/04042* (2013.01)

(58) Field of Classification Search
CPC ........ G02B 26/127; G02B 2006/12138; H01L 24/00; H01L 23/3121; H01L 2224/022; H01L 2224/04042
See application file for complete search history.

(56) References Cited

U.S. PATENT DOCUMENTS

| | | | |
|---|---|---|---|
| 2012/0074445 A1* | 3/2012 | Shimonishi | H01L 33/60 257/98 |
| 2016/0135301 A1* | 5/2016 | Miyake | H01L 21/565 361/760 |

FOREIGN PATENT DOCUMENTS

| | | |
|---|---|---|
| JP | H08-330637 A | 12/1996 |
| JP | 11-074496 A | 3/1999 |
| JP | 2005-072463 A | 3/2005 |
| JP | 2012-198482 A | 10/2012 |
| JP | 2013-168512 A | 8/2013 |
| WO | 2016/047417 A1 | 3/2016 |

* cited by examiner

*Primary Examiner* — Tony Ko
(74) *Attorney, Agent, or Firm* — Canon U.S.A., Inc. IP Division

(57) ABSTRACT

An optical sensor includes a bare chip mounted on a circuit board, a protection member configured to protect the bare chip, a pad connected to the bare chip via a wire, and a pattern connecting the pad and a terminal portion at an edge of the circuit board to each other. The pattern is connected to the terminal portion on a same surface as a surface on which the bare chip is mounted, and a portion of the pattern between the protection member and the terminal portion is covered with solder resist.

5 Claims, 9 Drawing Sheets

FRONT SURFACE ON WHICH BARE CHIPS ARE MOUNTED

SEE-THROUGH VIEW OF BACK SURFACE

SIDE VIEW

BEFORE RESIN
ENCAPSULATION

FILM ASSISTED
MOLDING (FAM)
PROCESS

AFTER RESIN
ENCAPSULATION

FRONT SURFACE ON WHICH BARE CHIPS ARE MOUNTED

SEE-THROUGH VIEW OF BACK SURFACE

SIDE VIEW

FRONT SURFACE ON WHICH BARE CHIPS ARE MOUNTED

SEE-THROUGH VIEW OF BACK SURFACE

SIDE VIEW

FRONT SURFACE ON WHICH BARE CHIPS ARE MOUNTED

SEE-THROUGH VIEW OF BACK SURFACE

SIDE VIEW

- - - - - DIVISION LINE

OPTICAL SENSOR, SCANNER UNIT, AND IMAGE FORMING APPARATUS

This application is a Continuation of U.S. application Ser. No. 15/654,369, filed Jul. 19, 2017, which claims the benefit of Japanese Patent Application No. 2016-144638, filed Jul. 22, 2016, which is incorporated by reference herein in its entirety.

BACKGROUND OF THE INVENTION

Field of the Invention

One disclosed aspect of the embodiments relates to a Chip On Board (COB)-type optical sensor.

Description of the Related Art

A laser beam printer or a copying machine as an image forming apparatus that forms an image on a sheet includes a scanner unit for forming an electrostatic latent image on a photosensitive drum serving as an image bearing member. The scanner unit includes optical components such as a semiconductor laser element that irradiates the photosensitive drum with laser light, and a polygon mirror for deflecting the laser light emitted from the semiconductor laser element to cause the laser light to scan on the photosensitive drum. Further, the scanner unit includes a horizontal synchronous detection sensor as a sensor that detects the laser light caused to scan on the photosensitive drum. This horizontal synchronous detection sensor is also called a beam detector (BD) sensor. In recent years, a small COB-type sensor has started to be widely employed as a sensor for detecting a light intensity that is equipped with a control integrated circuit (IC).

COB refers to a method for directly mounting bare chips on a printed circuit board. FIGS. 6A, 6B, and 6C illustrate one example of the small COB-type optical sensor. The optical sensor illustrated in FIGS. 6A, 6B, and 6C is the BD sensor used in the laser beam printer, and is configured in such a manner that bare chips including a photodiode 104 as a light receiving element and a calculation circuit 105 are directly mounted on a circuit board. At the time of manufacturing of the sensor, the sensor is manufactured by a method in which a plurality of sets of bare chips is mounted on a large circuit board and then the circuit board is divided into each sensor as illustrated in FIG. 7 (refer to Japanese Patent Application Laid-Open No. 2009-129930).

FIG. 6A illustrates the BD sensor after the division as viewed from a surface on which the bare chips are mounted (hereinafter referred to as a bare chip mounted surface). The bare chips including the photodiode 104 and the calculation circuit 105 are mounted at a center of the circuit board, and the bare chips are connected to a terminal 101 via a gold wire 106 and a pattern 103. The terminal 101 is provided at an edge of the circuit board, and serves as a connection portion when the BD sensor is mounted on another circuit board. The terminal 101 is obtained by dividing, along a division line, a through-hole formed in the circuit board before the division thereof, and is connected to both a front surface and a back surface of the circuit board. FIG. 6B is a view of the back surface side of the BD sensor obtained by seeing through the BD sensor, and the terminal 101 is disposed in the above-described manner. FIG. 6C illustrates the BD sensor as viewed from a side surface thereof. As illustrated in FIG. 6C, the bare chips are protected by covering a portion where the bare chips are mounted with a molded transparent acrylic resin 107 as a protection member.

However, considering such a case that the sensor is mounted so as to make the bare chip mounted surface of the sensor visible from an opposite surface of a surface on which the sensor is mounted, the conventional small COB-type optical sensor is assumed to have the following problem. FIG. 5 illustrates such a mounting method. When a sensor 110 is mounted on a circuit board 112, a hole is formed through the circuit board 112 according to a shape of the sensor 110, and the sensor 110 is mounted by being fitted in the hole in a state where the bare chip mounted surface of the sensor 110 is laid face down. Accordingly, the sensor 110 is mounted in such a manner that the bare chip mounted surface becomes the opposite surface of the surface on which the sensor 110 is mounted. This mounting method is assumed to be employed when the optical sensor is desired to be mounted with a light receiving surface positioned on an opposite surface of a surface on which components are mounted. This method brings about a merit of being able to reduce light reflected by a pad, the gold wire, and another component because the sensor can be positioned on the opposite side of the surface on which the components are mounted.

The problem will be described referring to the BD sensor illustrated in FIGS. 6A, 6B, and 6C by way of example. Since the BD sensor is mounted while the bare chip mounted surface is laid face down, the bare chip mounted surface illustrated in FIG. 6A becomes a surface that solder contacts. A land pattern of the circuit board 112 where the sensor is mounted is provided according to a position of the terminal 101 of the BD sensor, and cream solder 111 is also applied at the same position. When the BD sensor is mounted on the circuit board 112, the terminal 101 and the pattern 103 connected to the terminal 101 contact the cream solder 111. At this time, the solder 111 travels along the pattern 103, so that the terminal 101 may be left with an insufficient amount of solder 111. As a result, a solder fillet may not be able to be formed in an appropriate state on a surface in contact with the terminal 101. Further, if the heated solder 111 flowing along the pattern 103 contacts the transparent acrylic resin 107, the transparent acrylic resin 107 may also be deformed. Therefore, according to the configuration of the conventional small COB-type optical sensor, it is difficult to mount the sensor so as to make the bare chip mounted surface of the sensor visible from the opposite surface of the surface on which the sensor is mounted.

SUMMARY OF THE INVENTION

According to an aspect of the embodiments, one optical sensor includes a circuit board, a bare chip mounted on the circuit board, a protection member configured to protect the bare chip, a pad connected to the bare chip via a wire, and a pattern connecting the pad and a terminal portion at an edge of the circuit board to each other. The pattern is connected to the terminal portion on a same surface as a surface on which the bare chip is mounted, and a portion of the pattern between the protection member and the terminal portion is covered with solder resist.

According to another aspect of the embodiments, another optical sensor includes a circuit board, a bare chip mounted on the circuit board, a protection member configured to protect the bare chip, a pad connected to the bare chip via a wire, a through-hole formed through the circuit board, and a pattern connected to the pad via the through-hole. The pattern is connected to the through-hole on an opposite surface of a surface on which the bare chip is mounted, and is connected to the pad via the through-hole.

Further features of the disclosure will become apparent from the following description of exemplary embodiments with reference to the attached drawings.

DESCRIPTION OF THE EMBODIMENTS

Figure 1A:
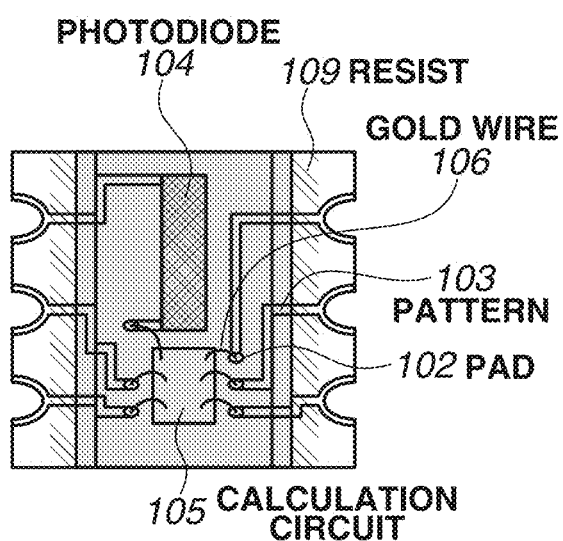
FIGS. 1A, 1B, and 1C illustrate a shape of a small Chip On Board (COB)-type sensor according to a first exemplary embodiment.
Figure 1B:
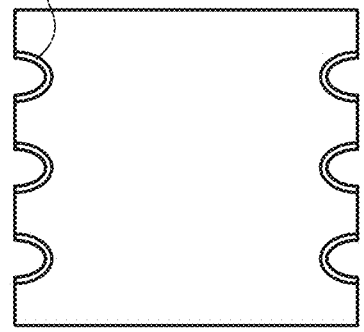
Figure 1C:
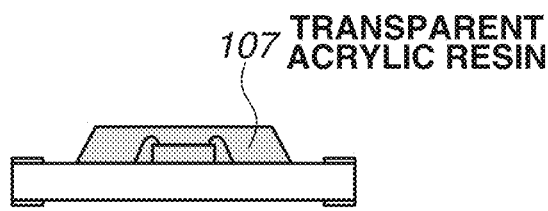

A configuration of an optical sensor according to a first exemplary embodiment of the disclosure will be described. FIGS. 1A, 1B, and 1C illustrate a shape of a small COB-type sensor according to the first exemplary embodiment. FIG. 1A illustrates the sensor as viewed from the front surface thereof (the bare chip mounted surface). FIG. 1B is a view of the back surface obtained by seeing through the sensor. FIG. 1C illustrates the sensor as viewed from the side surface thereof. The bare chips including a photodiode 104 as a light receiving element and a calculation circuit 105 are mounted around the center of the circuit board. The photodiode 104 as the light receiving element has a rectangular contour as illustrated in FIG. 1A. The mounted bare chips are respectively connected to a pad 102 on the circuit board by a gold wire 106 through wire bonding. The pad 102 is connected to a terminal 101 of a through-hole on an edge surface via a pattern 103 on a front surface side of the circuit board. In the present exemplary embodiment, the pad 102 is each connected with the gold wire 106 as the wire through wire bonding. The portion where the photodiode 104, the calculation circuit 105, the gold wire 106, and the pad 102 are mounted is covered with a transparent acrylic resin 107 as a protection member. Film Assisted Molding (FAM) is used to mold the transparent acrylic resin 107.

Figure 2A:
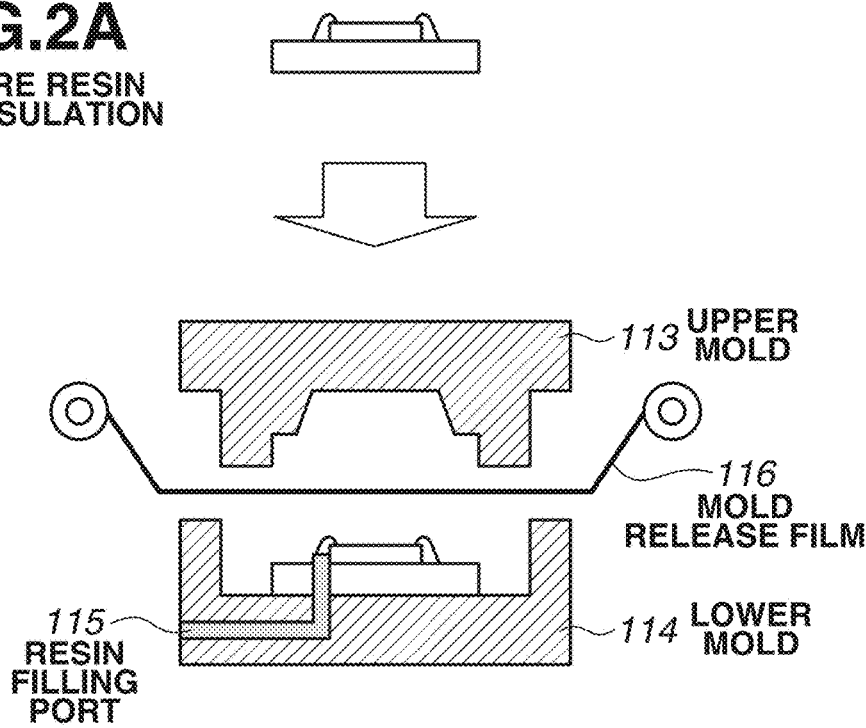
FIGS. 2A, 2B, and 2C illustrate an overview of Film Assisted Molding (FAM).
Figure 2B:
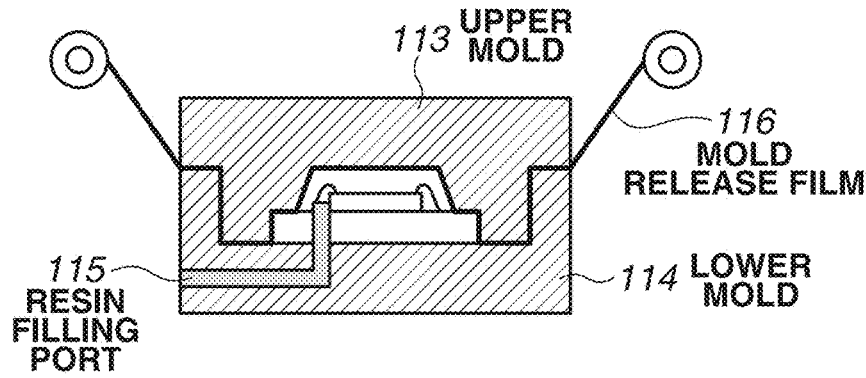
Figure 2C:
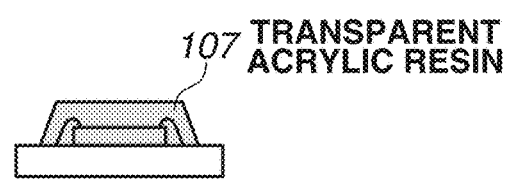

FIGS. 2A, 2B, and 2C illustrate an overview of an FAM process. FIG. 2A illustrates a state before resin encapsulation. FIG. 2B illustrates a state during the FAM process. FIG. 2C illustrates a state of the sensor after the resin encapsulation. As illustrated in FIG. 2B, the circuit board with the bare chips mounted thereon is sandwiched between an upper mold 113 and a lower mold 114, and the bare chips are covered with a mold release film 116. Then, the transparent acrylic resin 107 is poured from a resin filling port 115 into the molds 113 and 114. The mold release film 116 is inserted between the upper mold 113 and the resin 107 in the FAM process for the purpose of allowing the acrylic resin 107 to be molded on the circuit board with a high accuracy.

The first exemplary embodiment is characterized in that the pattern 103 is partially covered (coated) with solder resist 109 (hereinafter referred to as a resist) on the surface corresponding to the side where the bare chips are mounted. More specifically, a region from a portion where the terminal 101 and the pattern 103 are connected to each other to a portion that does not interfere with the transparent acrylic resin 107 is covered with the resist 109. This configuration according to the present exemplary embodiment brings about the following effects.

Specifically, even when the sensor is mounted while the bare chip mounted surface is laid face down and the solder comes into contact with the terminal 101 on the surface side where the bare chips are mounted, the covering with the resist 109 prevents the solder from flowing along the pattern 103. Therefore, an appropriate solder fillet is formed at the terminal portion. Further, the transparent acrylic resin 107 is also prevented from being deformed due to the contact of the solder thereto.

Further, partially covering the pattern 103 with the resist 109 so as to prevent the solder from flowing along the pattern 103 connected to the terminal 101 allows the sensor to be mounted by forming a hole through the circuit board where the sensor will be mounted and fittingly inserting the sensor in the hole. In other words, the present exemplary embodiment allows the sensor to be mounted so as to make the bare chip mounted surface visible from the opposite surface of the surface on which the sensor is mounted.

Figure 3A:
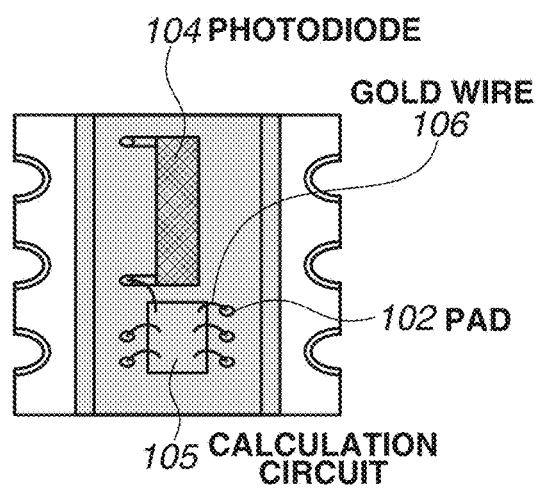
FIGS. 3A, 3B, and 3C illustrate a shape of a small COB-type sensor according to a second exemplary embodiment.
Figure 3B:
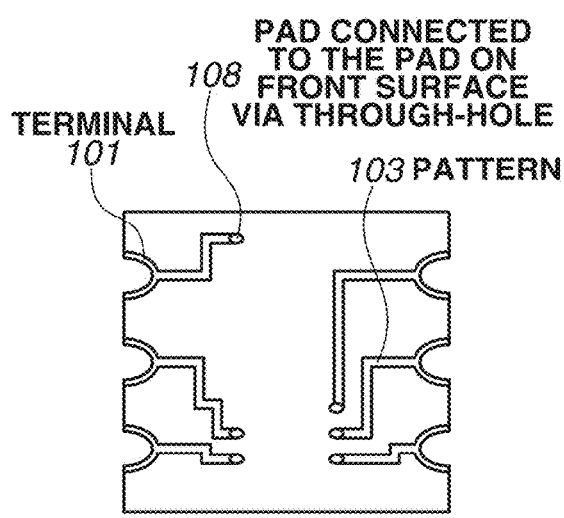
Figure 3C:
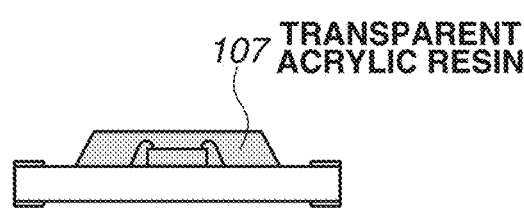

Next, a configuration of an optical sensor according to a second exemplary embodiment will be described with reference to FIGS. 3A, 3B, and 3C. FIG. 3A illustrates the sensor as viewed from the front surface thereof (the bare chip mounted surface). FIG. 3B is a view of the back surface obtained by seeing through the sensor. FIG. 3C illustrates the sensor as viewed from the side surface thereof. Descriptions of configurations similar to the first exemplary embodiment will be omitted below. The bare chips including the photodiode 104 and the calculation circuit 105 are mounted around the center of the circuit board. The mounted bare chips are respectively connected to the pad 102 on the circuit board by the gold wire 106 through wire bonding. In the present exemplary embodiment, the pattern 103 is not disposed at positions on the left side and the right side of the photodiode 104. Instead, the pattern 103 is disposed on the opposite surface via a through-hole. The sensor may be configured in such a manner that the pattern 103 is disposed on any one of the left side and the right side. Further, in the present exemplary embodiment, the pad 102 is each connected with the gold wire 106 through wire bonding.

Next, characteristics of the second exemplary embodiment will be described. The present exemplary embodiment is characterized in that the pad 102 is connected to the opposite surface of the circuit board via the through-hole, and the terminal 101 of the through-hole on the edge surface, which is provided at the edge of the circuit board, and a pad 108 are connected to the above-described pad 102 via the pattern 103 on the back surface side of the circuit board. The pattern 103 connecting the terminal 101 and the pad 102 to each other is disposed on the opposite surface of the bare chip mounted surface, which brings about the following effects.

The present exemplary embodiment allows the sensor to be mounted so as to make the bare chip mounted surface of the sensor visible from the opposite surface of the surface on which the sensor is mounted, which has been described in the description of the problem. Even when the sensor is mounted while the bare chip mounted surface is laid face down and the solder comes into contact with the terminal 101 on the surface side where the bare chips are mounted, the solder does not flow inwardly from the terminal 101 via the pattern 103 because the terminal 101 on the bare chip surface side is not connected to the pattern 103. In other words, the present exemplary embodiment allows the solder fillet to be stably formed at the terminal portion, thereby ensuring solder bonding strength. Further, the transparent acrylic resin 107 is also prevented from being deformed due to the contact of the solder thereto.

In the above-described manner, the present exemplary embodiment allows the sensor to be mounted by forming a hole through the circuit board where the sensor will be mounted and fittingly inserting the sensor in the hole. Further, the present exemplary embodiment allows the sensor to be mounted so as to make the bare chip mounted surface visible from the opposite surface of the surface on which the sensor is mounted. In other words, the present exemplary embodiment allows the small COB-shaped optical sensor to be provided.

In addition, because there is no step on the surface where the transparent acrylic resin 107 is in abutment with the circuit board when the acrylic resin 107 is molded in the FAM process, the present exemplary embodiment allows the transparent acrylic resin 107 to be molded on the circuit board with a high dimensional accuracy.

Therefore, the present exemplary embodiment allows the small COB-shaped optical sensor to be provided with the transparent acrylic resin 107 finished with the high dimensional accuracy.

Further, because the pattern 103 having a high reflectivity is not provided around the portion where the photodiode 104 is mounted, the present exemplary embodiment makes it possible to provide the small COB-shaped optical sensor capable of detecting a timing at which scanning light passes through without being affected by stray light.

Figure 4A:
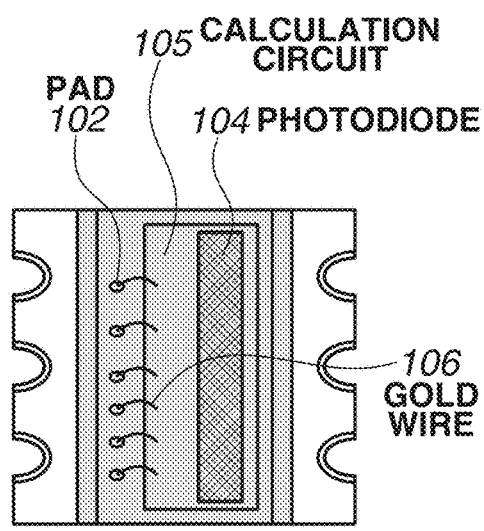
FIGS. 4A, 4B, and 4C illustrate a shape of a small COB-type sensor according to a third exemplary embodiment.
Figure 4B:
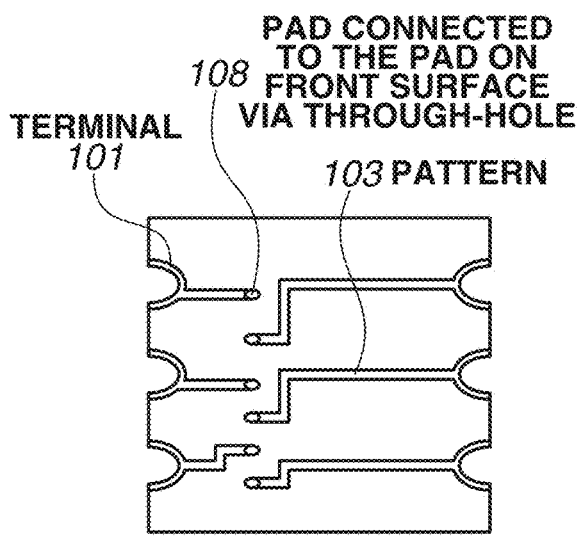
Figure 4C:
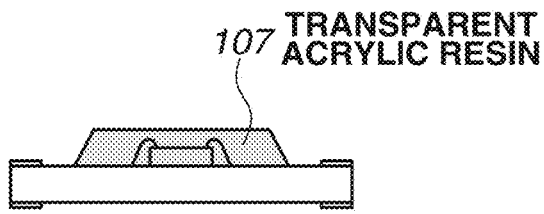
Figure 5:
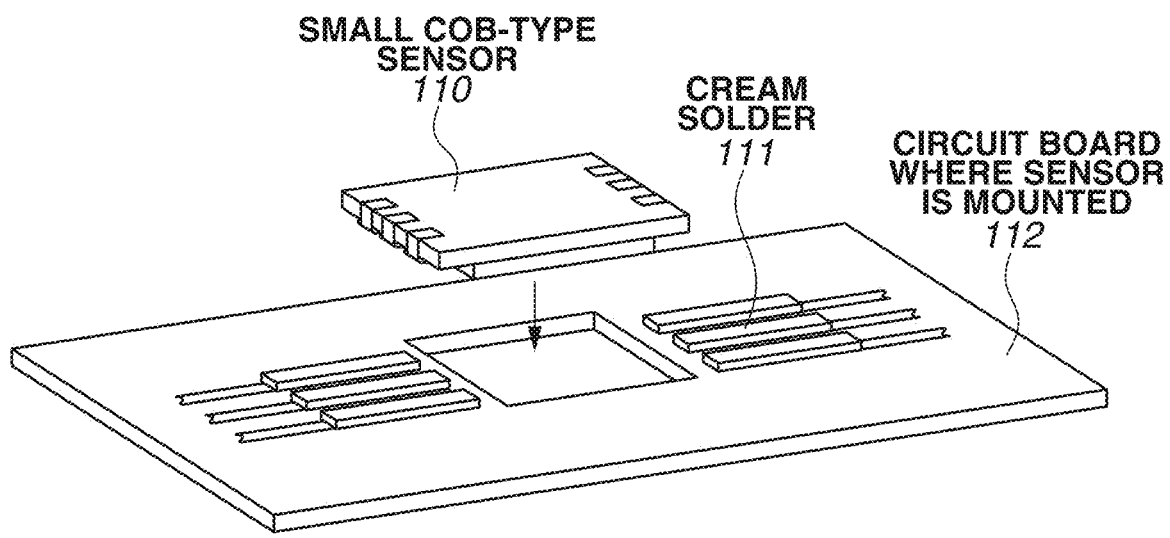
FIG. 5 illustrates a prior art method for mounting the sensor according to each of the exemplary embodiments.
Figure 6A:
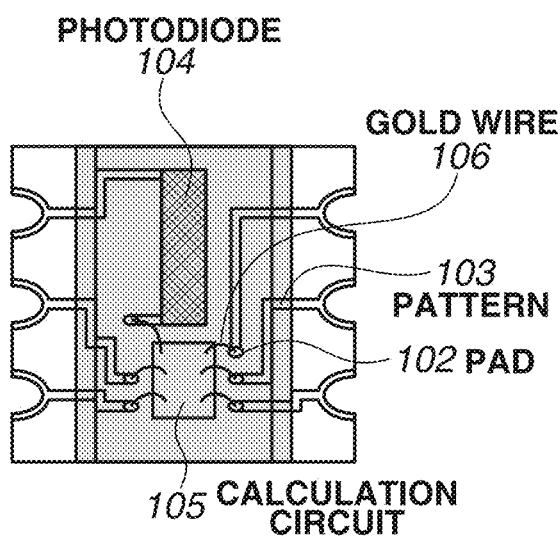
FIGS. 6A, 6B, and 6C illustrate a shape of a small COB-type sensor according to a conventional art.
Figure 6B:
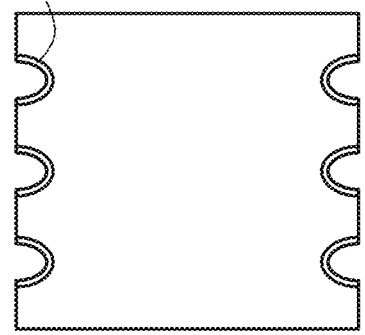
Figure 6C:
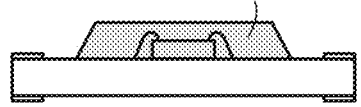
Figure 7:
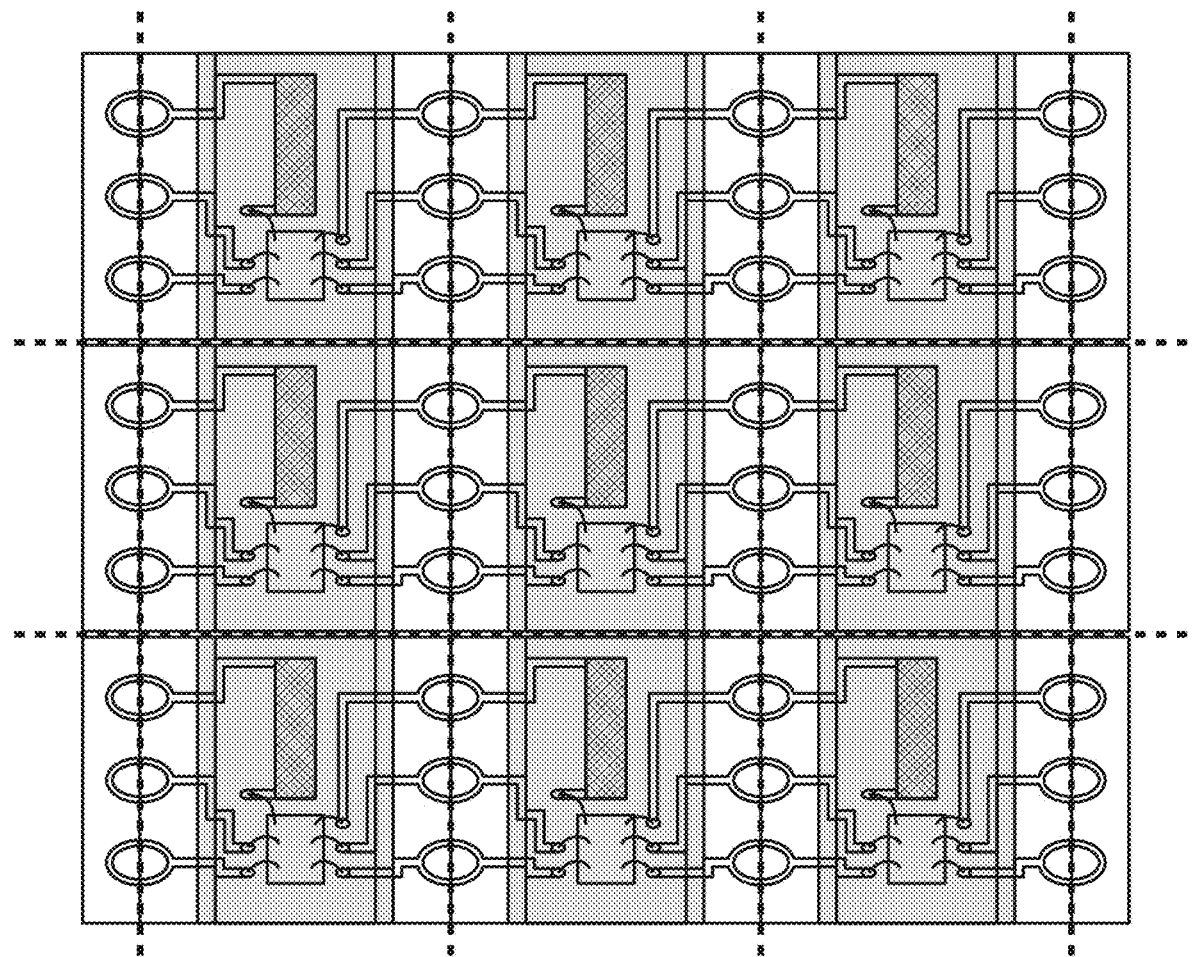
FIG. 7 illustrates the shape of the small COB-type sensor according to the conventional art (before a circuit board is divided).

A configuration of an optical sensor according to a third exemplary embodiment will be described. Descriptions of similar configurations to the first or second exemplary embodiment will be omitted below. FIGS. 4A, 4B, and 4C illustrate the configuration of the small COB-type sensor according to the present exemplary embodiment. FIG. 4A illustrates the sensor as viewed from the front surface thereof (the bare chip mounted surface). FIG. 4B is a view of the back surface obtained by seeing through the sensor. FIG. 4C illustrates the sensor as viewed from the side surface thereof.

As illustrated in FIG. 4A, the configuration according to the present exemplary embodiment is different from the first exemplary embodiment in terms of the configuration of the bare chip and the layout of the pad 102. In the present exemplary embodiment, the photodiode 104 and the calculation circuit 105 are constructed on the same bare chip. The present exemplary embodiment is characterized by such a configuration that the pad 102 is disposed on the left side of the photodiode 104 with respect to a longitudinal direction thereof and is not disposed on the right side thereof.

The configurations other than the configuration of the bare chip and the layout of the pad 102 are similar to the first exemplary embodiment, and therefore descriptions thereof will be omitted below. The pad 102 is connected to the opposite surface of the circuit board via the through-hole, and the terminal 101 of the through-hole on the edge surface, which is provided at the edge of the circuit board, and the pad 108 are connected to the above-described pad 102 via the pattern 103 on the back surface side of the circuit board. This configuration brings about similar effects to the second exemplary embodiment. Further, the pad 102 is disposed only on the left side of the photodiode 104 with respect to the longitudinal direction thereof and is not disposed on the right side thereof, which brings about the following effects.

In the BD sensor that detects the timing at which the light scanning on the optical sensor passes through the front side of the sensor, a light ray targeted for the detection is caused to scan from the right side toward the left side in FIG. 4A. When the light ray is caused to scan in this manner, the present exemplary embodiment allows the sensor to detect a timing at which the light ray reaches the photodiode 104 without being affected by diffused reflection of the light on the pad 102 and the gold wire 106. Therefore, the present exemplary embodiment makes it possible to provide the small COB-type optical sensor capable of detecting the timing at which the scanning light passes through without being affected by stray light.

<Image Forming Apparatus and Scanner Unit Including BD Sensor>

A scanner unit equipped with the BD sensor described in any of the above-described first to third exemplary embodiments, and an image forming apparatus including the scanner unit will be described.

Figure 8:
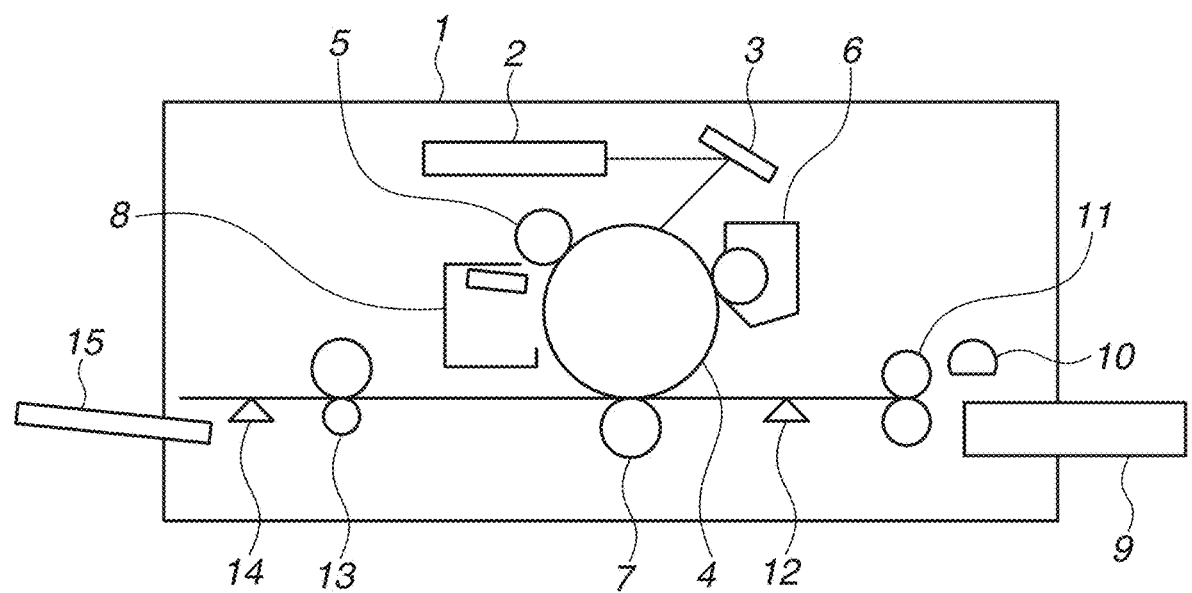
FIG. 8 is a cross-sectional view of an image forming apparatus including a scanner unit equipped with the BD sensor according to any of the exemplary embodiments.

FIG. 8 is a cross-sectional view of a laser beam printer including the optical sensor according to the first exemplary embodiment illustrated in FIGS. 1A, 1B, and 1C, as one example of the image forming apparatus. A folding mirror 3 is disposed in front of a scanner unit 2 in the laser beam printer 1 illustrated in FIG. 8. A photosensitive drum 4 is disposed in a reflection direction of the folding mirror 3. A charging unit 5, a development unit 6, a transfer unit 7, and a cleaner 8 are disposed in order around the photosensitive drum 4. Further, a cassette 9 is provided on a right side surface of the laser beam printer 1, and a sheet feeding roller 10, a conveyance roller 11, a sheet feed sensor 12, the transfer unit 7, a fixing unit 13, a sheet discharge sensor 14, and a sheet discharge tray 15 are arranged in order from the cassette 9 in a leftward direction. The laser beam printer 1 performs an operation of forming an image onto a sheet stacked in the cassette 9 in the following manner.

First, the sheet in the cassette 9 is fed by the sheet feeding roller 10 and is conveyed by the conveyance roller 11. Then, the photosensitive drum 4 is irradiated with a laser beam emitted from the scanner unit 2 and an electrostatic latent image is formed thereon in synchronization with the conveyance of the sheet. A surface of the photosensitive drum 4 is evenly charged by the charging unit 5 before the electrostatic latent image is formed. Then, the electrostatic latent image formed on the photosensitive drum 4 is developed by the development unit 6 with use of toner, and a toner image developed on the photosensitive drum 4 is transferred onto the sheet by the transfer unit 7. After that, the toner image is fixed onto the sheet by the unillustrated fixing unit 13 and the sheet is discharged onto the sheet discharge tray 15. The cleaner 8 cleans the photosensitive drum 4 to eliminate the toner left on the photosensitive drum 4 after the toner image is transferred onto the sheet.

Figure 9:
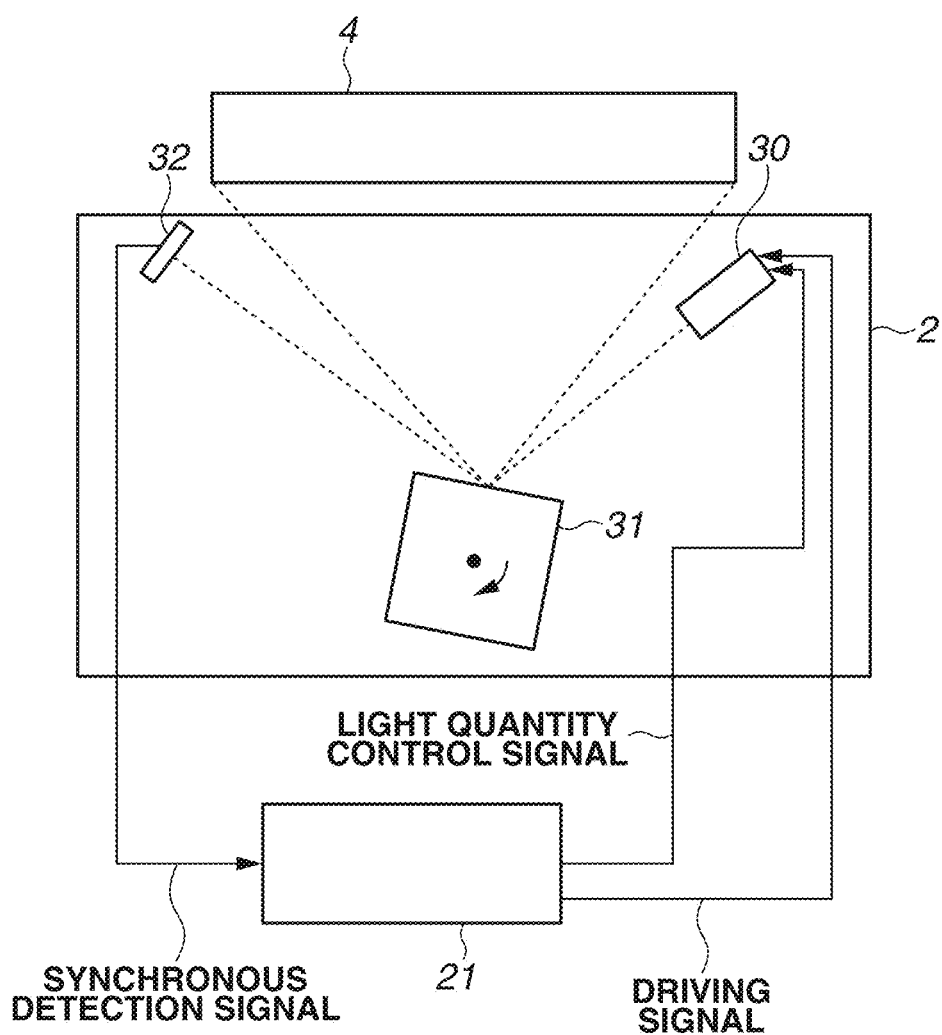
FIG. 9 schematically illustrates a configuration of the scanner unit equipped with the BD sensor according to any of the exemplary embodiments.

Next, a configuration of the scanner unit 2 will be described. FIG. 9 illustrates the configuration of the scanner unit 2. In the scanner unit 2 illustrated in FIG. 9, a polygon mirror 31 that is rotated by a scanner motor (not illustrated)

is disposed in front of a laser diode 30 as the semiconductor laser element. The photosensitive drum 4 and a BD sensor 32 are disposed in a reflection direction of the polygon mirror 31. Then, a line for a synchronous detection signal output from the BD optical sensor 32 is connected to a printer control circuit 21. This printer control circuit 21 controls the above-described operation of forming the image. In the scanner unit 2, the printer control circuit 21 outputs a signal for controlling a light quantity of the laser beam and a signal for driving the laser based on image data transmitted from an image controller (not illustrated). The laser diode 30 of the scanner unit 2 is controlled according to the signals from the printer control circuit 21, and the scanner unit 2 is controlled in such a manner that the laser beam scans on the photosensitive drum 4 by the polygon mirror 31 via the folding mirror 3.

In this manner, the BD sensor described in any of the above-described first to third exemplary embodiments can be applied as the BD sensor 32 of the scanner unit 2.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application is a continuation of patent application Ser. No. 15/654,369, filed Jul. 19, 2017, and claims the benefit of Japanese Patent Application No. 2016-144638, filed Jul. 22, 2016, which is hereby incorporated by reference herein in its entirety.

What is claimed is:

1. A scanner unit comprising:
   an optical sensor;
   a semiconductor laser element configured to emit a laser beam for irradiation; and
   a mirror configured to reflect the laser beam emitted from the semiconductor laser element,
   wherein the optical sensor includes:
      a circuit board,
      a bare chip mounted on the circuit board,
      a wire connected to the bare chip,
      a first pad provided on a surface, on which the bare chip is mounted, of the circuit board,
      a protection member configured to protect the bare chip, the wire and the first pad,
      a through-hole provided on the circuit board and connected to the first pad,
      a terminal provided at an edge of the circuit board,
      a second pad provided on an opposite surface of the surface on which the bare chip is mounted and connected to the through-hole,
      a pattern connected to the second pad and the terminal, and
      light receiving element mounted on a surface on which the bare chip is mounted,
   wherein when the circuit board is viewed in a direction perpendicular to a surface on the side on which the bare chip is mounted, the light receiving element and the first pad are arranged side by side, and the laser beam is detected by the light receiving element by irradiating the light receiving element with the laser beam from the side opposite to the side where the first pad is arranged.

2. The scanner unit according to claim 1, wherein the light emission element is a semiconductor laser element.

3. The scanner unit according to claim 1, wherein the protection member is a transparent acrylic resin.

4. An image forming apparatus comprising:
   an image bearing member configured to allow an image to be formed thereon;
   a scanner unit configured to irradiate the image bearing member with light to form a latent image on the image bearing member;
   a semiconductor laser element configured to emit a laser beam,
   wherein the scanner unit includes:
      a circuit board,
      a bare chip mounted on the circuit board,
      a wire connected to the bare chip,
      a first pad provided on a surface, on which the bare chip is mounted, of the circuit board,
      a protection member configured to protect the bare chip, the wire and the first pad,
      a through-hole provided on the circuit board and connected to the first pad,
      a terminal provided at an edge of the circuit board,
      a second pad provided on an opposite surface of the surface on which the bare chip is mounted and connected to the through-hole,
      a pattern connected to the second pad and the terminal, and
      a light receiving element mounted on a surface on which the bare chip is mounted,
   when the circuit board is viewed in a direction perpendicular to a surface on the side on which the bare chip is mounted, the light receiving element and the first pad are arranged side by side, and the laser beam is detected by the light receiving element by irradiating the light receiving element with the laser beam from the side opposite to the side where the first pad is arranged, and
   wherein the laser beam emitted from the semiconductor laser element included in the scanner unit and reflected by the mirror is detected by the light receiving element and the latent image is formed on the image bearing member as a result of the detected laser beam having been emitted to the image bearing member in synchronization with timing at which the laser beam is detected;
   a development unit configured to develop the latent image formed on the image bearing member; and
   a transfer unit configured to transfer an image obtained based on the latent image developed by the development unit onto a recording medium.

5. The image forming apparatus according to claim 4, wherein the protection member is a transparent acrylic resin.

* * * * *